(12) United States Patent
Verspecht

(10) Patent No.: US 7,268,530 B1
(45) Date of Patent: Sep. 11, 2007

(54) METHOD TO MEASURE THE MUTUAL PHASE RELATIONSHIP OF A SET OF SPECTRAL COMPONENTS GENERATED BY A SIGNAL GENERATOR

(76) Inventor: Jan Verspecht, Gertrudeveld 15, Londerzeel, Vlaams-Brabant (BE) B-1840

( * ) Notice: Subject to any disclaimer, the term of this patent is extended or adjusted under 35 U.S.C. 154(b) by 0 days.

(21) Appl. No.: 11/337,949

(22) Filed: Jan. 24, 2006

(51) Int. Cl.
  *G01R 23/20* (2006.01)
(52) U.S. Cl. ............... 324/76.52; 324/623; 702/69
(58) Field of Classification Search ............ 324/76.52, 324/601, 622, 623
  See application file for complete search history.

(56) References Cited

U.S. PATENT DOCUMENTS

| | | | | |
|---|---|---|---|---|
| 3,867,702 | A * | 2/1975 | Torpie et al. | 324/620 |
| 4,721,901 | A * | 1/1988 | Ashley | 324/646 |
| 5,495,497 | A * | 2/1996 | Bond et al. | 375/130 |
| 5,742,201 | A * | 4/1998 | Eisenberg et al. | 330/2 |
| 6,980,915 | B2 * | 12/2005 | Gorin et al. | 702/111 |
| 7,006,553 | B1 * | 2/2006 | McCorkle | 375/130 |
| 7,035,324 | B2 * | 4/2006 | Mar et al. | 375/224 |
| 2004/0113632 | A1 * | 6/2004 | Anderson | 324/622 |

OTHER PUBLICATIONS

Jan Verspecht and Ken Rush,"Individual Characterization of Broadband Sampling Oscilloscopes with a Nose-to-Nose Calibration Procedure," IEEE Transactions on Instrumentation and Measurement. pp. 347-354, vol. 43, No. 2, Apr. 1994.
Jan Verspecht, "Large-Signal Network Analysis—'Going beyond S-parameters'," 62nd ARFTG Conference Short Course Notes, pp. 30-33, USA, Dec. 2003.

* cited by examiner

*Primary Examiner*—Anjan Deb

(57) ABSTRACT

A novel method is described that enables the measurement of the phase of the spectral components generated by an harmonic phase reference generator without using a calibrated sampling oscilloscope. First one uses a vector network analyzer to measure the output reflection coefficient of an harmonic phase transfer standard and of the harmonic phase reference generator that needs to be characterized. Next one connects the transfer standard to a microwave receiver and one measures the spectral components that are generated by the transfer standard. One then connects the harmonic phase reference generator to be characterized to the microwave receiver. The spectral components of the harmonic phase reference generator to be characterized are calculated by using the spectrum of the transfer standard as measured by the receiver, the spectrum of the harmonic phase reference generator to be characterized as measured by the receiver and the known spectrum of the transfer standard.

3 Claims, 2 Drawing Sheets

METHOD TO MEASURE THE MUTUAL PHASE RELATIONSHIP OF A SET OF SPECTRAL COMPONENTS GENERATED BY A SIGNAL GENERATOR

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

SEQUENCE LISTING OR PROGRAM

Not Applicable

INCORPORATION-BY-REFERENCE OF MATERIAL SUBMITTED ON A CD

Not applicable

BACKGROUND OF THE INVENTION

1. Field of the Invention

This invention relates to the measurement of the mutual phase relationship of the spectral components generated by a signal generator. Such a measurement is necessary if one wants to use the signal generator as an harmonic phase reference generator. An harmonic phase reference generator is a repetitive electrical pulse generator with an adjustable repetition rate, also called the fundamental frequency. An harmonic phase reference generator is used as the harmonic phase standard for a "large-signal network analyzer", also known as LSNA. An LSNA, typically operating in the microwave frequency range, measures time varying electrical quantities like the current waveforms and voltage waveforms at the terminals of an electrical device like for example a diode or a transistor. The characterization of an harmonic phase reference generator itself is time consuming and can take more than a whole day. An harmonic phase reference generator is completely characterized when one knows its output reflection coefficient as a function of frequency across its full bandwidth of operation and when one knows the amplitude of and the mutual phase relationship between all the spectral components which are generated by the harmonic phase reference generator, and this for a multitude of fundamental frequencies.

2. Description of the Related Art

Many prior art methods exist to measure the phase difference between two spectral components that have exactly the same frequency, as it is described e.g. by Anderson (U.S. 2004/0113632 A1). Such a phase measurement is typically performed by a network analyzer, which measures the phase difference between the signal that is incident to a device-under-test and the signal, at exactly the same frequency, that is transmitted or reflected by the device-under-test. Many methods also exist to measure the amplitudes of a set of spectral components that are generated by a signal generator, as described by Gorin et al. (U.S. Pat. No. 6,980,915 B2). Such an amplitude measurement is typically performed by a spectrum analyzer. None of the abovementioned prior art methods can be used, however, to measure the mutual phase relationship of a set of spectral components that are generated by one signal generator. This type of phase measurement is technically difficult because all of the spectral components that are subject to the phase measurements have a different frequency. The measurement of the mutual phase relationship of a set of spectral components that are generated by a signal generator is necessary for characterizing so-called harmonic phase reference generators that are used for calibrating a large-signal network analyzer (LSNA), a new microwave instrument that was commercially introduced in 2003. The harmonic phase reference generator is used to eliminate the phase distortion error of the instrument.

In the prior art only one method is described for the characterization of an harmonic phase reference generator. The method is explained in the following. The output reflection coefficient of the harmonic phase reference generator is measured by a vector network analyzer. Next a microwave sampling oscilloscope is characterized by using the nose-to-nose calibration method as described in "Individual Characterization of Broadband Sampling Oscilloscopes with a 'Nose-to-Nose' Calibration Procedure", by Jan Verspecht and Ken Rush, published in IEEE Transactions on Instrumentation and Measurement, Vol. 43, No. 2, pp. 347-354, April 1994. The harmonic phase reference generator to be characterized is then connected to the input of the oscilloscope and the repetitive electrical pulse which appears at the output of the harmonic phase reference generator is being measured and digitized by the oscilloscope. This process is illustrated in FIG. 1. After being digitized by the oscilloscope the measured waveforms are processed by a computer that calculates the phase and amplitude of all spectral components generated by the harmonic phase reference generator. The spectral components are calculated using the discrete Fourier transform algorithm. The whole process is explained in "Large-Signal Network Analysis—'Going beyond S-parameters'" by Jan Verspecht, 62nd ARFTG Conference Short Course Notes, USA, December 2003. The method explained above is the only method I know of that is used to characterize harmonic phase reference generators and has significant disadvantages. A first disadvantage is that the method requires a measurement lab which is equipped with at least three microwave sampling oscilloscope modules and two oscilloscope mainframes in order to be able to perform a 'nose-to-nose' calibration procedure. A second disadvantage of the method is that it takes a long time to perform. Even after one has performed a nose-to-nose calibration, which by itself takes one day, it still takes at least several hours for the characterization of one harmonic phase reference generator for a multitude of fundamental frequencies. This is a real problem when a whole series of harmonic phase reference generators needs to be calibrated. With the invented method one does not need sampling oscilloscopes and the characterization of one harmonic phase reference generator is possible in less than 15 minutes.

BRIEF SUMMARY OF THE INVENTION

This invention is a method to characterize harmonic phase reference generators that is much faster than the prior art and which does not require the repeated use of calibrated sam pling oscilloscopes. The new method is based on using one harmonic phase reference generator as a transfer standard. The harmonic phase reference generator transfer standard is the only harmonic phase reference generator which needs to be characterized by the method described in the prior art. All other harmonic phase reference generators are characterized by comparing them to the harmonic phase reference generator transfer standard using the invented method.

The preferred embodiment of the new method requires a harmonic phase reference generator transfer standard, a vector network analyzer and a broadband microwave receiver which may be uncalibrated. A systematic linear distortion may be present in measurements performed with the broadband microwave receiver. First one uses the vector network analyzer to measure the output reflection coefficient of the harmonic phase reference generator transfer standard and of all the harmonic phase reference generators to be characterized. Next one connects the harmonic phase reference generator transfer standard to the microwave receiver and one measures the phase and the amplitude of the spectral components, which are generated by the harmonic phase reference generator transfer standard, for a multitude of fundamental frequencies. The measurements described above are sufficient to characterize the linear transfer characteristic of the broadband microwave receiver. One then disconnects the harmonic phase reference generator transfer standard from the receiver and one connects the harmonic phase reference generators to be characterized to the microwave receiver. One then measures the phase and the amplitude of the spectral components which are generated by the harmonic phase reference generator to be characterized for a multitude of fundamental frequencies. The phases and amplitudes of the output spectra of the harmonic phase reference generators to be characterized can then accurately be determined by making calculations based on the harmonic phase reference generator transfer standard output spectrum measurement, the output spectrum measurement of the harmonic phase reference generators to be characterized, the knowledge of the phase and amplitude of the spectral components of the harmonic phase reference generator transfer standard (which has been determined a priori using prior art), and the measured output reflection coefficients of the microwave receiver, the harmonic phase reference generators to be characterized and the harmonic phase reference generator transfer standard.

Figure 1:
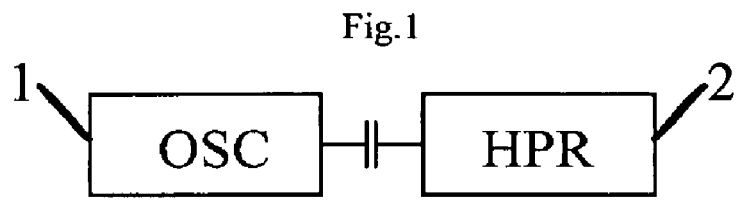
FIG. 1 is a block diagram showing the measurement set-up as it is described in the prior art using a calibrated oscilloscope.

REFERENCE NUMERALS 1 sampling oscilloscope that has been calibrated by using the "nose-to-nose" procedure
2 harmonic phase reference generator to be characterized
3 vector network analyzer
4 harmonic phase reference generator transfer standard
5 broadband microwave receiver

DETAILED DESCRIPTION OF THE INVENTION

The preferred embodiment of the invented method is described in what follows. The problem that is solved by the new method is the efficient measurement of the phase and amplitude of the output spectrum, noted $S_{HPR}$, of an harmonic phase reference generator 2, and this for a multitude of fundamental frequencies. An harmonic phase reference generator is a repetitive electrical pulse generator with an adjustable repetition rate, also called the fundamental frequency. The output signal of an harmonic phase reference generator is repetitive and the output spectrum contains as such a discrete set of spectral components. Each of these spectral components is mathematically represented by a complex number, having a real and imaginary part, or equivalently having an amplitude and a phase. Advanced applications, like e.g. the calibration of a "large-signal network analyzer", require the accurate knowledge of the time domain waveform of the pulse that is generated by the harmonic phase reference generator. In stead of characterizing the time domain waveform by using an oscilloscope, as with the prior art, the new method allows to calculate the time domain waveform by measuring the amplitude as well as the phase of the spectral components. The amplitude and phase of the spectral components are measured by using a broadband microwave receiver. The phase distortion of this receiver is eliminated from the measurement by using one harmonic phase reference generator as a transfer standard. The use of this transfer standard, which itself needs to be characterized by the prior art methods, allows for a fast characterization of any other harmonic phase reference standard.

The method determines the output spectrum $S_{HPR}$ by using an a priori characterized harmonic phase reference generator 4 as a transfer standard, and this for the multitude of fundamental frequencies. The amplitude and phase of the output spectral components generated by transfer standard 4 has been characterized by using prior art, e.g. by using an oscilloscope 1 which has been calibrated by the nose-to-nose calibration procedure. This illustrated in FIG. 1. The a priori known output spectrum of transfer standard 4 is noted $S_{TRA}$.

Figure 2:
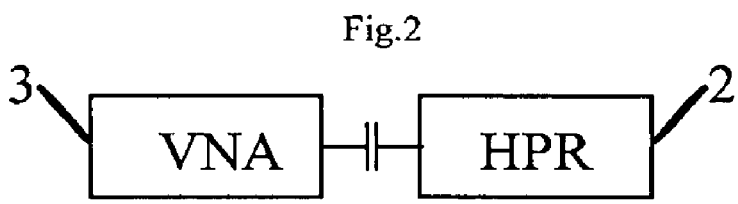
FIG. 2 is a block diagram illustrating the part of the new measurement method where the VNA is connected with the harmonic phase reference generator to be characterized.
Figure 3:
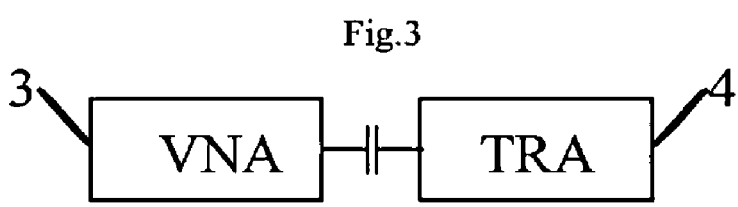
FIG. 3 is a block diagram illustrating the part of the new measurement method where the VNA is connected with the harmonic phase reference generator transfer standard.
Figure 4:
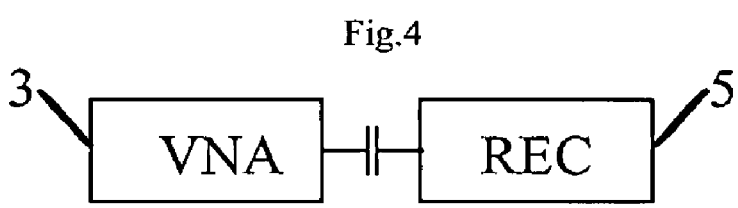
FIG. 4 is a block diagram illustrating the part of the new measurement method where the VNA is connected with the broadband microwave receiver.
Figure 5:
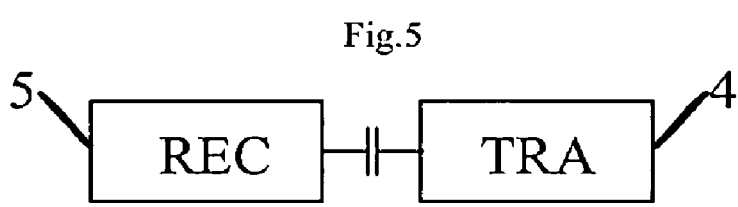
FIG. 5 is a block diagram illustrating the part of the new measurement method where the transfer standard harmonic phase reference generator is connected with the broadband microwave receiver.
Figure 7:
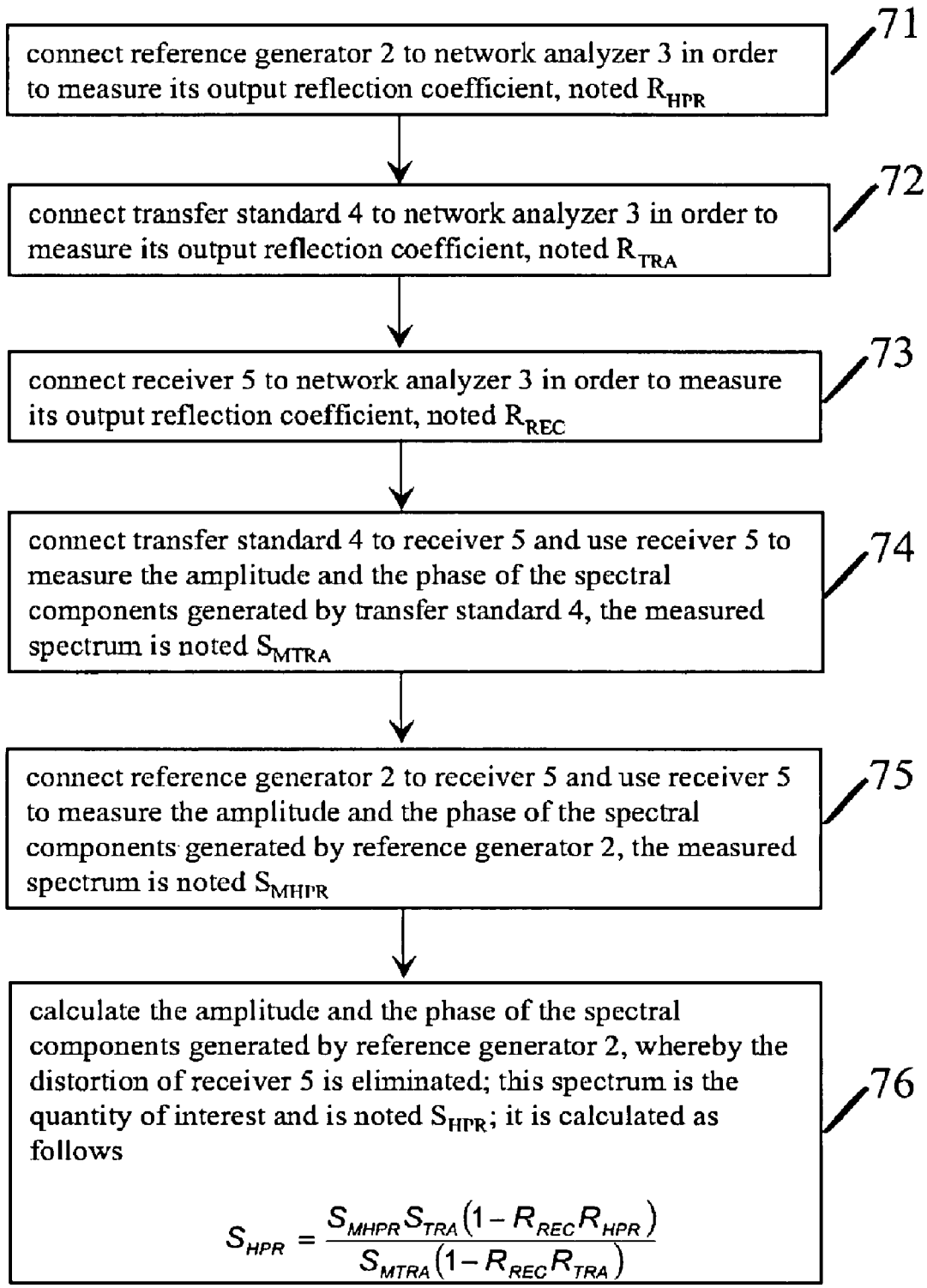
FIG. 7 is a flow chart of the steps of the new method.

The steps of the new method are illustrated by the flowchart depicted in FIG. 7. The first step 71 of the new method is also shown in FIG. 2. Reference generator 2 is connected to a network analyzer 3 in order to measure its output reflection coefficient, which is noted $R_{HPR}$. If the output reflection coefficient of transfer standard 4 is a priori unknown, it is measured by connecting transfer standard 4 to the network analyzer 3, this is the second step 72 in the flowchart, it is also depicted in FIG. 3. The output reflection coefficient of transfer standard 4 is noted $R_{TRA}$. The new method uses a broadband microwave receiver 5 which has a linear transfer characteristic which is noted $T_{REC}$. The linear transfer characteristic $T_{REC}$ introduces a linear distortion in any spectrum measured by receiver 5. The new method does not require $T_{REC}$ to be known. The output reflection coefficient of receiver 5 is measured by connecting the input connector of receiver 5 to the test port of the network analyzer 3, this is the third step 73 in the flow chart, it is also shown in FIG. 4. The output reflection coefficient of receiver 5 is noted $R_{REC}$. Next one connects transfer standard 4 to receiver 5, this is the fourth step 74 in the flow chart, it is also shown in FIG. 5, and one uses receiver 5 to measure the amplitude and the phase of the spectral components generated by transfer standard 4, and this for the said multitude of fundamental frequencies. The corresponding measured output spectrum is noted $S_{MTRA}$. $S_{MTRA}$ is given by $$S_{MTRA} = \frac{T_{REC} S_{TRA}}{1 - R_{REC} R_{TRA}}. \qquad \text{Eq. 1}$$

Figure 6:
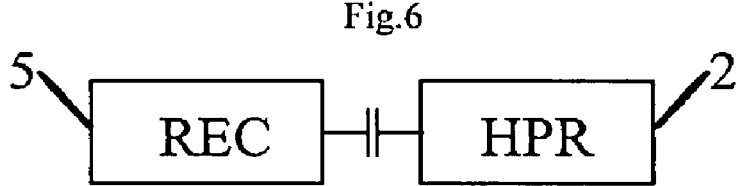
FIG. 6 is a block diagram illustrating the part of the new measurement method where the harmonic phase reference generator to be characterized is connected with the broadband microwave receiver.

Note that $S_{MTRA}$ is different from the actual output spectrum $S_{TRA}$, since it has been linearly distorted by the transfer characteristic $T_{REC}$ of receiver 5 as well as by the mismatch effects represented by $R_{REC}$ and $R_{TRA}$. Next one connects reference generator 2 to receiver 5, this is the fifth step in the flowchart, it is also shown in FIG. 6, and one uses receiver 5 to measure the phase and amplitude of the spectral components generated by reference generator 2, and this for said multitude of fundamental frequencies. The corresponding measured output spectrum is noted $S_{MHPR}$. $S_{MHPR}$ is given by $$S_{MHPR} = \frac{T_{REC} S_{HPR}}{1 - R_{REC} R_{HPR}}. \qquad \text{Eq. 2}$$

Note that $S_{MHPR}$ is different from the actual output spectrum $S_{HPR}$, since it has been linearly distorted by the unknown transfer characteristic $T_{REC}$ as well as by the mismatch effects represented by $R_{REC}$ and $R_{HPR}$. In Eq. 1 and Eq. 2 the only unknowns are $T_{REC}$ and $S_{HPR}$. The other quantities $S_{MTRA}$, $S_{MHPR}$, $T_{REC}$, $S_{TRA}$, $R_{REC}$, and $R_{TRA}$ are known. The quantity of interest $S_{HPR}$ is calculated for the said multitude of fundamental frequencies in the sixth step 76 of the flowchart and is given by the following formula $$S_{HPR} = \frac{S_{MHPR} S_{TRA} (1 - R_{REC} R_{HPR})}{S_{MTRA} (1 - R_{REC} R_{TRA})}. \qquad \text{Eq. 3}$$

With the new method as described above one characterizes reference generator 2 without the use of an oscilloscope measurement as it is always done with the method described in the prior art. This is achieved by using the a priori characterized transfer standard 4. The different measurement steps as illustrated in the flowchart of FIG. 7 can be performed in any arbitrary order without having an influence on the result. In some cases the reflection coefficients $R_{REC}$, $R_{HPR}$ and $R_{TRA}$ are known a priori or have such a small value that they can be neglected. In that case the first step 71, the second step 72 and the third step 73 may be omitted.

From Eq. 1 one concludes that the measured quantities $S_{MHPR}$, $R_{REC}$, $R_{TRA}$ and the a priori known $S_{TRA}$ can also be used to determine the amplitude and the phase of the a priori unknown transfer characteristic $T_{REC}$ of receiver 5. This is done through the application of the following equation.

$$T_{REC} = \frac{S_{MTRA} (1 - R_{REC} R_{TRA})}{S_{TRA}} \qquad \text{Eq. 4}$$

What is claimed is:

1. A method comprising the steps of:
    connecting a first signal generator that generates a first set of spectral components to a broadband microwave receiver whereby the mutual phase relationship of said first set of spectral components is accurately known and whereby said broadband microwave receiver has a phase distortion error;
    using said broadband microwave receiver to generate a measurement of the mutual phase relationship of said first set of spectral components;
    connecting a second signal generator that generates a second set of spectral components to said broadband microwave receiver;
    using said broadband microwave receiver to generate a measurement of the mutual phase relationship of said second set of spectral components;
    eliminating said phase distortion error of said broadband microwave receiver from said measurement of the mutual phase relationship of said second set of spectral components by using said measurement of the mutual phase relationship of said first set of spectral components and said measurement of the mutual phase relationship of said second set of spectral components and said accurately known mutual phase relationship of said first set of spectral components.

2. The repetition of the method described in claim 1 for a multitude of fundamental frequencies.

3. The method of claim 1 whereby one uses the measured output reflection coefficients of said microwave receiver, said first signal generator and said second signal generator to correct said second measurement of the mutual phase relationship of said second set of spectral components for distortion caused by mismatch effects.

* * * * *